United States Patent [19]

Jordan

[11] Patent Number: 5,134,415
[45] Date of Patent: Jul. 28, 1992

[54] SWITCHABLE LOCAL OSCILLATOR FOR SHARED MIXER RADIOMETERS

[75] Inventor: James R. Jordan, Boulder, Colo.

[73] Assignee: The United States of America as represented by the Secretary of Commerce, Washington, D.C.

[21] Appl. No.: 710,598

[22] Filed: Jun. 5, 1991

[51] Int. Cl.$^5$ .............................. G01S 3/02; H03L 1/00
[52] U.S. Cl. ................................. 342/351; 331/175
[58] Field of Search ................ 342/351; 331/9, 10, 331/175

[56] References Cited

U.S. PATENT DOCUMENTS

| | | | |
|---|---|---|---|
| 2,547,890 | 5/1948 | Rubin | 331/4 |
| 2,586,497 | 5/1942 | Ginzton et al. | 331/6 |
| 2,668,232 | 5/1945 | Tunick | 331/6 |
| 2,677,058 | 9/1949 | Kirkman | 331/9 |
| 2,681,414 | 6/1954 | Strandberg | 331/4 |
| 2,715,185 | 10/1952 | Roeschke | 331/6 |
| 2,752,495 | 5/1951 | Kroger | 331/5 |
| 2,770,733 | 11/1956 | Norton | 331/2 |
| 2,934,645 | 4/1960 | Dyke | 331/6 |
| 3,599,202 | 8/1971 | Foiani | 342/351 |
| 3,665,467 | 5/1972 | Haroules et al. | 342/351 |
| 3,911,435 | 10/1975 | Mardon et al. | 342/351 |
| 4,700,146 | 10/1987 | Barton | 331/7 |

OTHER PUBLICATIONS

Guiraud et al., "A Dual-Channel Microwave Radiometer for Measurement of Precipitable Water Vapor and Liquid", IEEE Transactions on Geoscience Electronics, vol. GE-17, No. 4 (Oct. 1979), pp. 129-134.

Schroeder et al., "Design Considerations for a Network of Thermodynamic Profilers" Journal of Atmospheric and Oceanic Technology, vol. 6, No. 5 (Oct. 1989), pp. 840-845.

Janssen "Data Buoy Microwave Temperature Sounder Performance and Evaluation" National Oceanic and Atmospheric Administration (Feb. 1987).

*Primary Examiner*—Gregory C. Issing
*Attorney, Agent, or Firm*—Robert G. Lev; Alvin Englert; John H. Raubitschek

[57] ABSTRACT

A switchable local oscillator for use in a shared mixer radiometer is capable of providing at least two separate frequencies. The local oscillator contains at least two cavity resonators, a voltage controlled oscillator controlling a microwave generator, a microprocessor to intermittently control the voltage controlled oscillator and an output voltage detection circuit to provide output voltage levels to the microprocessor. The microprocessor controls the voltage controlled oscillator to tune the microwave generator through a frequency range. Output voltage level of the local oscillator is detected, and a resonant frequency is determined. In response, the microprocessor fixes the voltage of the voltage controlled oscillator at a voltage corresponding to the resonant frequency of one of the cavity resonators. Microprocessor control of the voltage controlled oscillator is then relinquished. The local oscillator generates a resonant frequency while measurements are made by the radiometer. Once measurements at the first resonant frequency are complete, the microprocessor reacquires control of the voltage controlled oscillator, and the process is repeated for the resonant frequency of another cavity resonator.

16 Claims, 3 Drawing Sheets

SWITCHABLE LOCAL OSCILLATOR FOR SHARED MIXER RADIOMETERS

TECHNICAL FIELD

The present invention relates generally to the design and control of local oscillators and more particularly to local oscillators for radiometers.

BACKGROUND ART

A common type of radiometer for detecting the presence of specific materials is provided with separate mixers and local oscillators for each frequency used in the measurement process. An example of this design is found in Guiraud, F.O. et al. "A Dual-Channel Microwave Radiometer for Measurement of Precipitable Water Vapor and Liquid", IEEE Trans. Geosci. Electron, GE-17 (1979), pp. 129-136. This design produces a stable, high-sensitivity instrument, but the high cost of millimeter wave components limits the implementation of a network of such devices.

As an alternative to this design, shared mixer radiometers are successfully used in networks of radiometric profiling systems since their cost is much lower than that of the design disclosed in Guiraud et al. However, shared mixer designs require a switchable frequency local oscillator having sufficient stability so as not to degrade the radiometer's accuracy even when the local oscillator is repeatably switched.

Accurate radiometer measurement requires a high number of readings to be repeatably taken at different frequencies. Repeatability, that is, the capability to maintain the same frequency characteristic through multiple frequency switching processes, is a critical factor in local oscillator design for the shared mixer configuration.

One type of local oscillator for radiometer use consists of multiple Gunn oscillators connected to a power combiner. This arrangement allows any frequency to be selected by applying power to one Gunn oscillator at a time. The major drawback of this technique is lack of temperature stability of the Gunn oscillators when they are turned on and off. To compensate, long settling times are required between frequency changes, thus reducing the efficiency and sensitivity of the radiometer.

One solution to the aforementioned problem is the use of PIN diode switches to improve temperature stability. The PIN diode switches select one Gunn oscillator at a time so that power is always applied to all the oscillators. This method is more completely described in the publication Schroeder, J.A. et al., "Design considerations of a network of thermodynamic profilers", J. Atmos. Oceanic Technol. (1989). While this technique decreases the time between frequency changes, it also increases the cost of the local oscillating system.

Another type of stable, switchable local oscillator requires use of a phase lock loop. This technique produces the most stable and repeatable source possible. However, a separate stable frequency source and other millimeter wave components such as a second mixer and coupler are required. Consequently, the cost of a phase lock loop oscillator system is too great to practically be used throughout an entire network of radiometer profilers.

Another way to achieve an inexpensive and stable local oscillating system for a shared mixer radiometer is the use of frequency multiplied oscillators. A stable low-frequency oscillator is used to provide a signal which is then multiplied up to millimeter wave frequencies. However, drift and stability of the low frequency oscillator are also multiplied along with the frequency. Consequently, stringent requirements are placed on the low frequency source. The costs of the frequency multipliers and a high quality low frequency source can exceed the costs of other local oscillator designs.

An important concern in local oscillator design for use in shared mixer radiometers is a balance between two factors. The first is oscillator stability required for radiometer use. The second is oscillator cost which mitigates against the deployment of large numbers of local oscillators in a multiple radiometer network.

DISCLOSURE OF THE INVENTION

An object of the invention is to balance an oscillator control system between stability and low cost to permit deployment of a large number of such oscillators throughout an extensive network.

Another object of the invention is to generate multiple frequencies in a local oscillator at a stability level sufficient for radiometer use but without the expense of multiple oscillators, a phase lock loop or high quality components normally required for millimeter wave generation.

A further object of the invention is to control an otherwise free running Gunn generator so that rapid switching between frequencies with acceptable repeatability can be achieved.

Another object of the invention is to intermittently control a local oscillator for use in a shared mixer radiometer network.

According to the present invention, a shared mixer radiometer is fed by at least one local oscillator. The local oscillator has a microwave generator controlled by a voltage controlled oscillator, and at least two cavity resonators having different resonant frequencies. A control means intermittently causes the voltage controlled oscillator to sequentially tune the microwave generator through a plurality of frequencies. The control means also sets a first voltage of the voltage controlled oscillator corresponding to the resonant state of one of the cavity resonators. A means for detecting voltage level responsive to the output of the local oscillator is connected to the control means, which sends output signals to the voltage controlled oscillator through a digital to analog converter means.

Another aspect of the present invention is a method of stabilizing a local oscillator. The local oscillator has a single voltage controlled oscillator and at least two cavity resonators. The voltage controlled oscillator is controlled to tune the local oscillator through a plurality of frequencies. The voltage level at the output of the local oscillator is detected. When the resonant state of one of the cavity resonators is determined, a first signal is generated. In response to the first signal the voltage controlled oscillator is set at the voltage corresponding to the resonant state detected. Control of the voltage control oscillator is relinquished and a first resonant frequency is generated by the local oscillator for a predetermined time period.

Control of the voltage controlled oscillator is resumed after the predetermined period. The voltage controlled oscillator is controlled to tune the local oscillator through a second range of frequencies. The voltage level at the output of the local oscillator is detected.

When the resonant state of another cavity resonator is determined, a second signal is generated. Responsive to this second signal a second voltage of the voltage controlled oscillator corresponding to the resonant state of the second cavity resonator is set. Control of the voltage controlled oscillator is released and a second resonant frequency is generated by the local oscillator for a second predetermined time period.

BEST MODE FOR CARRYING OUT THE INVENTION

Figure 1:
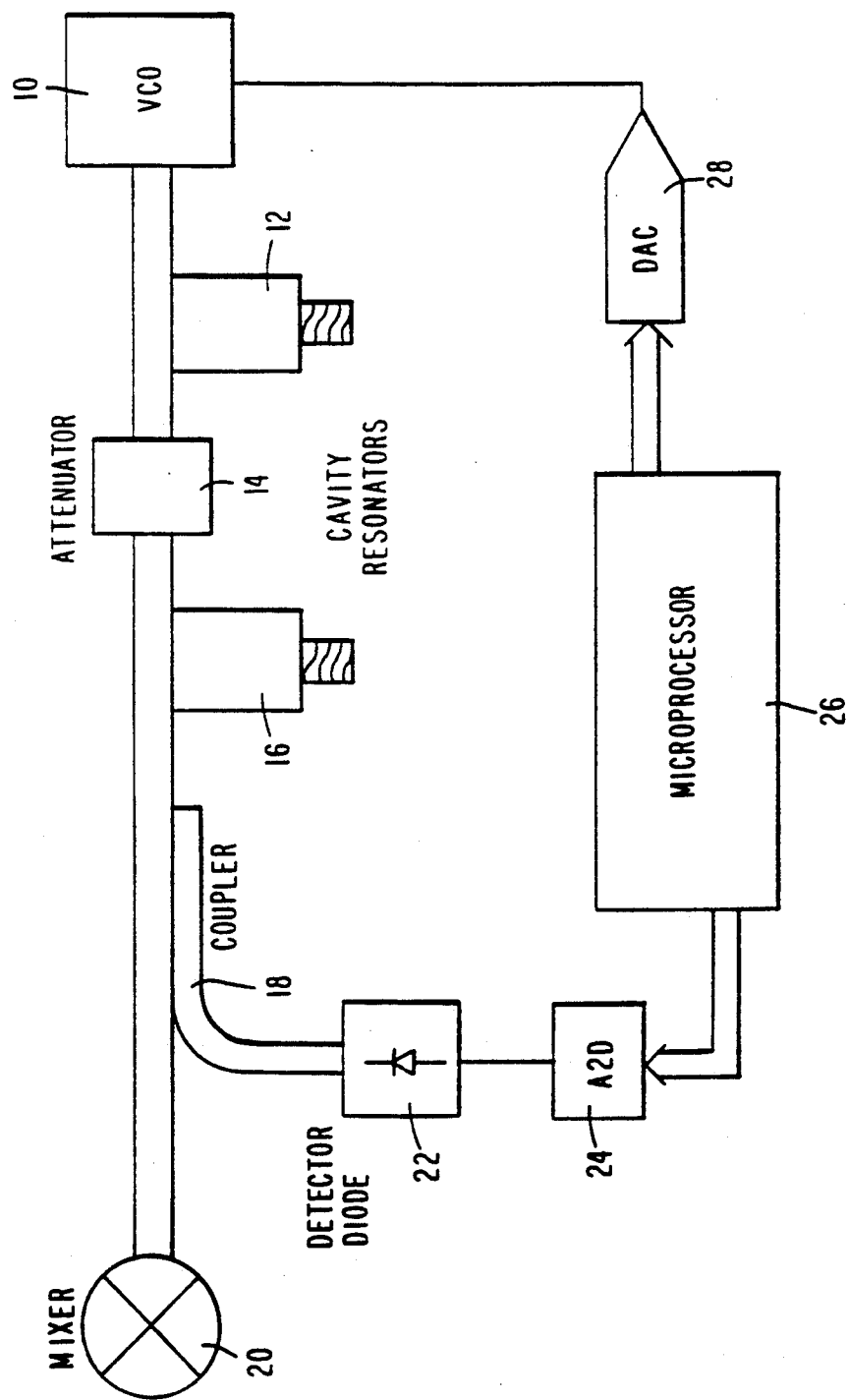
FIG. 1 is a block diagram showing one embodiment of the invention.

One embodiment of the invention as shown in FIG. 1 is practiced using two cavity resonators (12, 16) separated by an attenuator 14 and fed by a microwave generator controlled by a voltage controlled oscillator (both shown as 10). The voltage controlled oscillator is intermittently controlled by a microprocessor 26 having an output operated on by a digital-to-analog converter 28 and fed to the voltage control oscillator. The microprocessor detects signals from the output of the local oscillator by means of a coupler 18 feeding a detector diode 22 and an analog-to-digital converter 24.

Figure 2A:
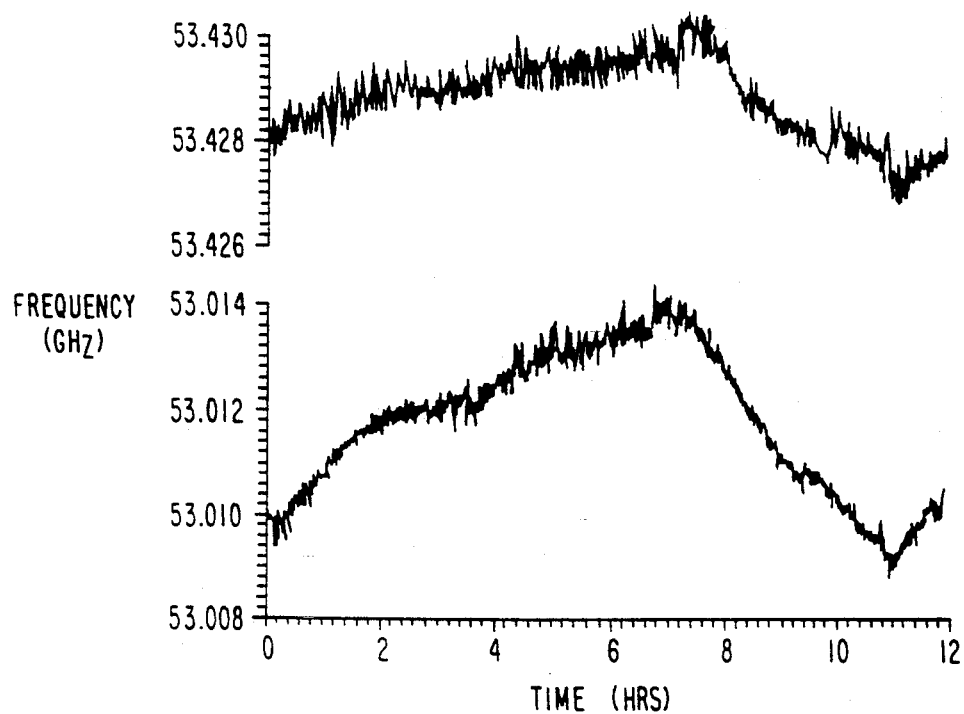
FIG. 2A shows repeatability and stability test results for the present invention.
Figure 2B:
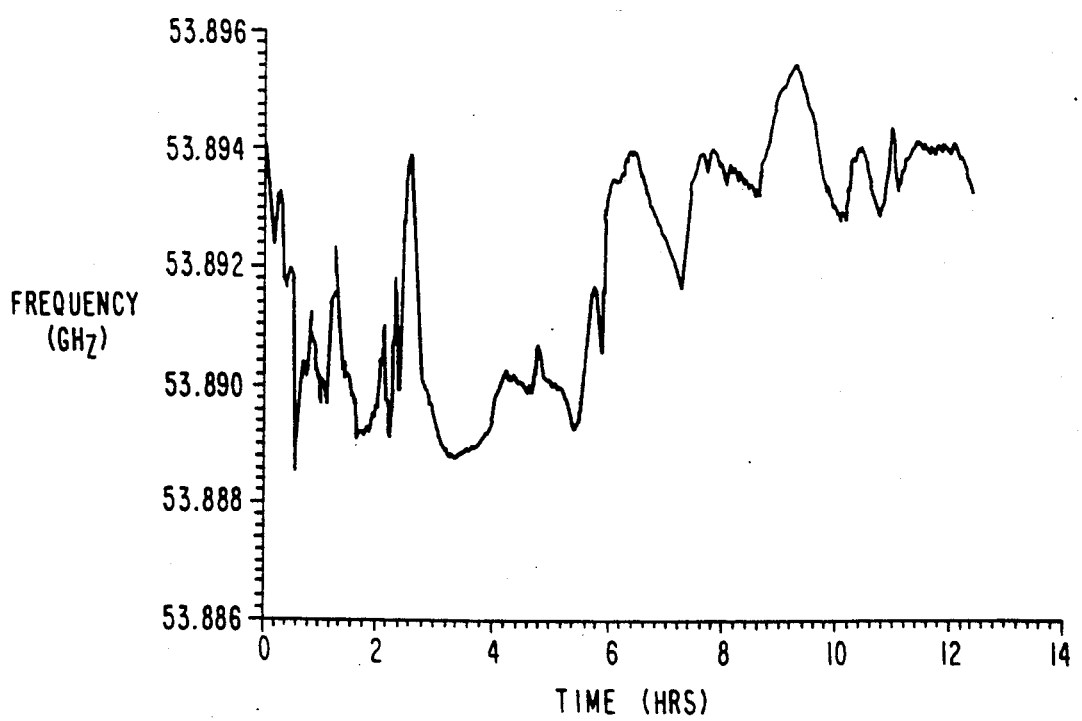
FIG. 2B shows repeatability and stability test results for a free running Gunn oscillator.

The microwave generator is of the well known Gunn generator type and normally has repeatability and stability characteristics suitable for a radiometer at only one frequency if permitted to run free. FIG. 2B is a graph of frequency responses for a free running Gunn generator subject to temperature control. This plot shows a twelve hour time series for a local oscillator frequency of 53.85 GHz. In contrast, FIG. 2A is a graph of frequency response for an intermittently controlled Gunn generator. The plot shows a twelve hour time series for two frequencies, without the benefit of temperature control. The measured variation of 8 MHz peak to peak for the temperature-controlled, free running Gunn generator is larger than the peak to peak drift measured for the intermittently controlled Gunn oscillator without the benefit of temperature control. The difference in stability provided by intermittent microprocessor control permits the use of such devices as switchable local oscillators in radiometers.

The microprocessor 26 controls the voltage controlled oscillator so that it is tuned through a first pre-determined voltage range. As a result, the microwave generator is tuned through part of its characteristic frequency range, and the local oscillator produces output signals. These output signals are detected by coupler 18 connected to the output of the local oscillator prior to the connection to mixer 20. The diode detector 22 outputs signals indicative of voltage level. These signals are operated on by the analog-to-digital converter and fed to the microprocessor. The resulting digital signals are stored in the microprocessor for the entire first pre-determined voltage range of the voltage controlled oscillator.

The first pre-determined voltage range is programmed into the microprocessor, and roughly corresponds to the resonant frequency of one of the cavity resonators. When the voltage controlled oscillator has been tuned through the entire first pre-determined voltage range, a resonant frequency of the first cavity resonator is determined from the stored voltage values. A corresponding tuned voltage from the first pre-determined voltage range is determined for the resonant frequency, and the microprocessor sets the voltage controlled oscillator to the corresponding tuned voltage. As a result, the microwave generator is tuned to the resonant frequency. Once the corresponding tuned voltage is set, the microprocessor relinquishes control of the voltage controlled oscillator. Measurements are made by the radiometer at the resonant frequency of the first cavity resonator. During the measurement period, the microwave generator in effect runs free.

Figure 3:
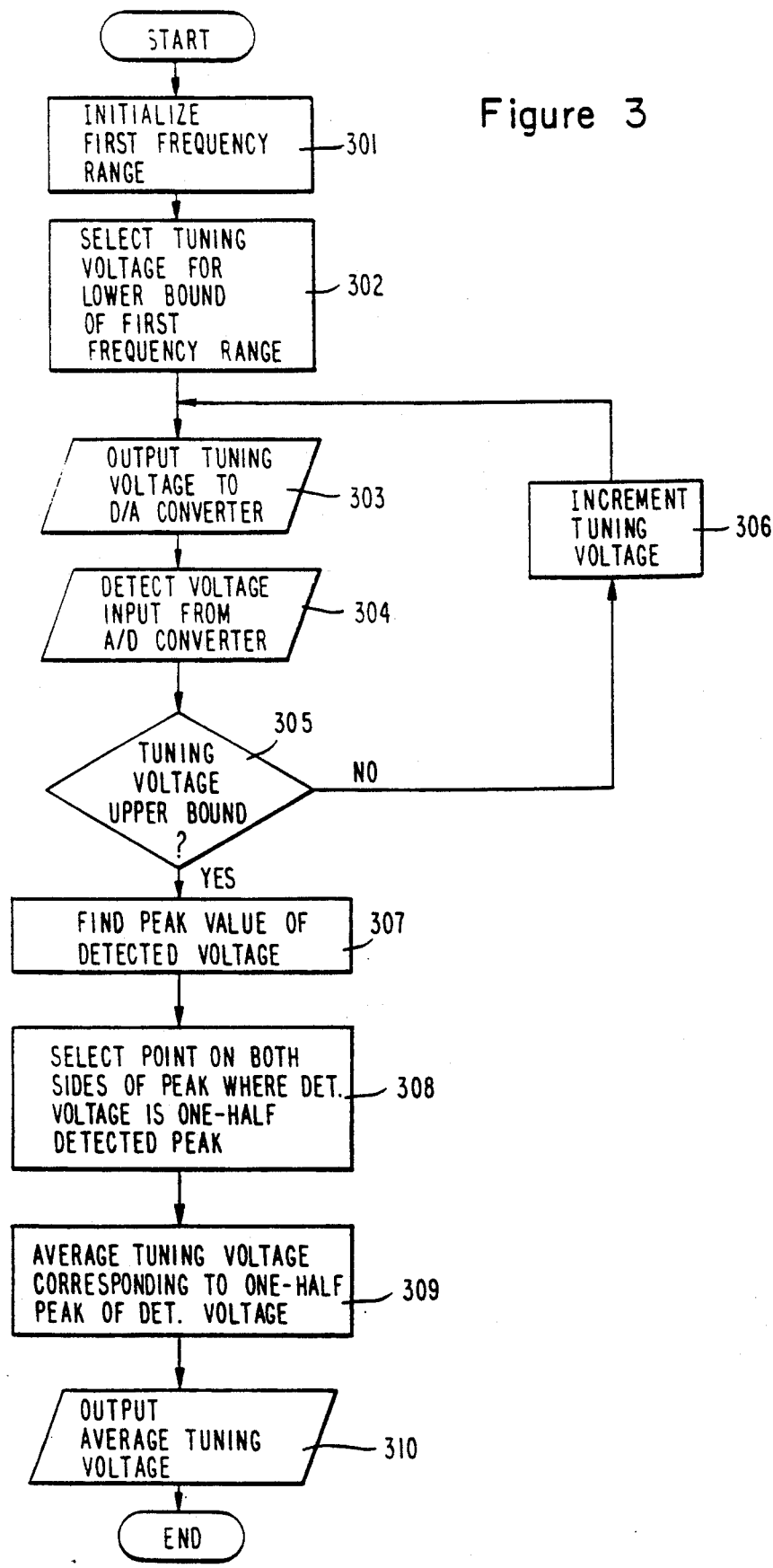
FIG. 3 is a flow chart illustrating an example of microprocessor operation used to carry out the present invention.

FIG. 3 shows a preferred method of operating the microprocessor controlling the inventive local oscillator. The microprocessor is programmed to initialize a first frequency range as part of the duty cycle of the overall radiometer (step 301). Also programmed into the microprocessor is a tuning voltage corresponding to the lower bound of the first frequency range. This tuning voltage is selected (step 302) and output to the digital-to-analog converter (step 303), and from there to the voltage controlled oscillator (not part of processor program). Voltage is detected from the output of the local oscillator, processed by the analog-to-digital and input to the microprocessor (step 304). The microprocessor then determines if the tuning voltage corresponds to the upper bound of the first frequency range (step 305). If not, the tuning voltage is incremented upwards (step 306), and output once again (step 303) to the voltage controlled amplifier, via the digital-to-analog converter. The incrementing process is continued (step 306) until the value of the tuning voltage corresponds to the upper bound of the first frequency range. When this condition occurs, the microprocessor finds the peak detected voltage and determines its value (step 307). Using this information the microprocessor then determines points in the sequence of detected voltage values where the detected voltage value on either side of the peak is one-half that of the detected peak (step 308). The tuning voltages from the first pre-determined voltage range corresponding to the one-half peak detected voltages are averaged (step 309); this average tuning voltage is output (step 310) through the digital-to-analog converter to the voltage controlled oscillator. At this point, the process ends until reinitiated by the measurement demands of the radiometer.

When the radiometer measurements at the resonant frequency of the first cavity resonator are complete, the microprocessor once again takes control of the voltage controlled oscillator causing it to scan through a second pre-determined voltage range repeating the previously described process. The radiometer makes measurements at the resonant frequency of the second cavity resonator and the microprocessor does not pick up control of the voltage controlled oscillator until the radiometer is required to switch frequencies again. This process is repeated; alternating between the two resonant frequencies until a sufficient number of measurements has been made to ensure radiometer accuracy.

In another embodiment of the invention, the voltage controlled oscillator generates a frequency of approximately 60 GHz and is used with a frequency multiplier to obtain an output of approximately 183 Ghz. Stability is provided by the aforementioned technique of intermittent microprocessor control; drift of the original source is limited to such an extent that a radiometer can employ this kind of local oscillator for profiling water vapor in the atmosphere.

In a further embodiment of the invention more than two cavity resonators can be used. When this is the case, the microprocessor will cause the voltage controlled oscillator to tune the microwave generator to the frequency corresponding to the resonant state of each cavity resonator as required by the measurement cycle of the radiometer. Virtually any combination of frequency selection and repetition is possible using the microprocessor control and multiple cavity resonators. Other methods of operating the microprocessor can be used to accommodate such variations.

For long term measurements temperature control of the cavity resonators is important to maintain stability. Further, each pair of cavity resonators should be separated by an attenuator to provide isolation.

Another benefit of intermittent microprocessor control of the voltage controlled oscillator is that the microprocessor is freed for a substantial amount of time to be used for other purposes. The result is savings in the microprocessor requirements, lowering costs for the entire system. This is a critical factor when deploying an entire network of radiometers.

In further variations, signal sources other than a Gunn generator can be used. Also, cavity resonators are not required. Other frequency selective devices such as tuned filters can be substituted.

Adjusting the voltage controlled oscillator to the voltage corresponding to the detected resonant state results in a far more stable local oscillator than that provided by an entirely free running Gunn oscillator, as shown in FIGS. 2A and 2B. This is accomplished without the expense of multiple phase lock loops, additional oscillators or high quality oscillating components normally required for millimeter wave generation. Consequently, the cost of radiometers employing this type local oscillator in a shared mixer configuration is low enough to make increased employment of radiometers in a network more feasible than with previous designs.

Although a number of arrangements of the invention have been mentioned by way of example, it is not intended that the invention be limited thereto. Accordingly, the invention should be considered to include any and all configurations, modifications, variations, combinations or equivalent arrangements falling within the scope of the next claims.

I claim:

1. A shared mixer radiometer having at least one local oscillator, said local oscillator comprising:
   a single voltage controlled oscillator means capable of generating multiple frequencies;
   a microwave generator controlled by said voltage controlled oscillator;
   control means to intermittently control said voltage controlled oscillator to sequentially tune said microwave generator through a plurality of frequencies and to set said voltage controlled oscillator to a first voltage corresponding to a resonant state;
   digital-to-analog converter means to convert output signals of said control means to control signals to be input to said voltage controlled oscillator;
   at least two cavity resonators fed by said microwave generator, and having different resonant frequencies; and
   means for detecting voltage level responsive to an output of said local oscillator, connected to said control means.

2. The device of claim 1 wherein said control means is a microprocessor.

3. The device of claim 1 wherein said cavity resonators are temperature controlled.

4. The device of claim 1 wherein said microwave generator is a Gunn generator.

5. The device of claim 1 wherein said means for detecting voltage level comprises a detector diode, a analog-to-digital converter and a coupler responsive to an output of said local oscillator.

6. The device of claim 1 comprising more than two cavity resonators.

7. The device of claim 1 wherein said microwave generator further comprises a frequency multiplier.

8. The device of claim 1 further comprising an attenuator operatively connected between said cavity resonators.

9. The device of claim 5 further comprising an attenuator operatively connected between each pair of cavity resonators.

10. A method of stabilizing a local oscillator having a single voltage controlled oscillator and at least two cavity resonators, said method comprising the steps of:
    (a) attaining control of the voltage controlled oscillator to tune said local oscillator through a plurality of frequencies;
    (b) detecting voltage level at an output of said local oscillator;
    (c) determining a resonant state of a first one of said cavity resonators and generating a first signal in response thereto;
    (d) in response to said first signal, fixing said voltage controlled oscillator to a first voltage corresponding to the resonant state of said first one of said cavity resonators;
    (e) releasing control of said voltage control oscillator and generating a first resonant frequency for a first predetermined time period;
    (f) resuming control of said voltage controlled oscillator to tune said local oscillator through a second plurality of frequencies;
    (g) detecting voltage level at an output of said local oscillator;
    (h) determining a resonant state of a second one of said cavity resonators and generating a second signal;
    (i) in response to said second signal, fixing said voltage controlled oscillator to a second voltage corresponding to the resonant state of said second one of said cavity resonators; and
    (j) releasing control of said voltage controlled oscillator and generating a second resonant frequency for a second predetermined time period.

11. The method of claim 10 wherein steps (a)–(j) are sequentially repeated a plurality of times.

12. The method of claim 10 wherein said local oscillator includes more than two cavity resonators, and wherein said method further comprises performing steps (a)–(e) for each cavity resonator.

13. The method of claim 12 wherein steps (a)–(e) are performed for each said cavity resonator selected in a specific sequence, said sequence being repeated a plurality of times.

14. The method of claim 10 wherein said step of determining a resonant state comprises:

storing values of a sequence of voltages detected at an output of said local oscillator;

determining the peak value of said detected voltages;

determining a pair of third voltages for said voltage controlled oscillator, corresponding to values of said detected voltages measured to be one half said peak value and detected on either side of said peak value in said sequence of detected voltages;

averaging said third voltages; and outputting said average of said third voltages from a microprocessor means.

15. The method of claim 10 wherein said local oscillator is used in a shared mixed radiometer.

16. An atmospheric measurement network having plural radiometers, at least some of said radiometers being of a shared mixer type, each said shared mixer radiometer having a plurality of switchable frequency local oscillators, each of said local oscillators comprising:

a microwave generator;

control means to intermittently control said microwave generator;

a plurality of frequency selective devices to select resonant frequencies for said local oscillator; and feedback means for providing local oscillator output signals to said control means.

* * * * *